United States Patent [19]

O'Coin

[11] Patent Number: 5,883,789
[45] Date of Patent: Mar. 16, 1999

[54] METHOD OF MOUNTING A PC BOARD TO A HYBRID

[75] Inventor: James R. O'Coin, Somers, Conn.

[73] Assignee: United Technologies Corporation, Windsor Locks, Conn.

[21] Appl. No.: 934,297

[22] Filed: Sep. 19, 1997

[51] Int. Cl.$^6$ ................................................ H05K 7/12
[52] U.S. Cl. .................... 361/769; 174/138 G; 361/760; 361/767
[58] Field of Search ......................... 29/832; 174/138 D, 174/138 E, 138 G, 166 S; 228/189, 180.21, 212, 218, 221; 257/718, 719, 723, 724, 726, 727, 785; 324/755, 756, 757; 361/760, 767, 769, 770, 771, 782, 783, 807, 808, 809; 438/117; 439/68, 73, 80, 81, 82

[56] References Cited

U.S. PATENT DOCUMENTS

| | | | |
|---|---|---|---|
| 3,896,544 | 7/1975 | Fosnough | 29/832 |
| 4,126,756 | 11/1978 | Krumme | 174/138 G |
| 4,607,782 | 8/1986 | Mims | 228/180.21 |
| 4,703,393 | 10/1987 | Yamamoto et al. | 361/767 |
| 5,109,269 | 4/1992 | Holzman | 361/770 |
| 5,255,159 | 10/1993 | Seyk | 361/770 |
| 5,543,363 | 8/1996 | Tokunoh et al. | 438/117 |
| 5,690,270 | 11/1997 | Gore | 228/189 |

*Primary Examiner*—Donald Sparks

[57] ABSTRACT

A system for mounting a hybrid electronic component to a PC board is disclosed. The system includes a set of brackets for mutually engaging a first surface of the PC board and a cover surface of the hybrid electronic component, wherein the cover surface has an arcuate shape when in a vacuum environment. The brackets are designed with legs having lengths and thicknesses for providing clearance between the cover surface of the hybrid and the first surface of the PC board for use when the hybrid electronic component is in a vacuum environment.

18 Claims, 1 Drawing Sheet

METHOD OF MOUNTING A PC BOARD TO A HYBRID

This invention was made with Government support under NAS3-25082 awarded by the NASA. The Government has certain rights in this invention.

TECHNICAL FIELD

This invention is directed to electronics packaging, and more specifically to a unique packaging arrangement for use with hybrid electronic components.

BACKGROUND ART

Hybrids are custom electronic components which contain microelectronics and circuitry encased in a hermetically sealed housing. Currently, the packaging of hybrids within an electronic box is done on a case-by-case basis depending upon the constraints of the design. In designing such packaging, mechanical or structural, electrical and thermal and manufacturability are the primary considerations. For certain applications, the hybrid packaging and arrangement must be designed to withstand extremely high vibratory loads. Also, existing structural mounting techniques for hybrids are not satisfactory under high heat dissipation applications. Typically, the existing techniques include sandwiching the PC board between the hybrid and a wall of the electronics box and providing a multitude of plated holes in the PC board beneath the hybrid as the thermal conductive path. However, through this design, the amount of heat dissipation is not adequately addressed. In addition, in these designs the hybrid leads are often subject to structure threatening loads.

There exists a need therefore, for a method and structure for packaging and mounting hybrid components in an electronics box relative to a PC board to account for vibration loads, high heat dissipation, and hybrid lead safety.

DISCLOSURE OF THE INVENTION

The primary object of this invention is to provide an improved packaging and mounting system for use with a hybrid electronic component, a PC board and an electronics box.

Another object of this invention is to provide an improved packaging and mounting system for use with a hybrid electronic component and a PC board such that sufficient hybrid component heat dissipation is allowed.

Still another object of this invention is to provide for an improved mounting and packaging system for use with a hybrid electronic component and a PC board, which provides for the required structural support for accounting for high vibratory loads which may arise.

And still another object of this invention is to provide an improved mounting and packaging system for use with hybrid electronic components, which allows for use of the hybrid and PC board in a vacuum environment while maintaining a safe environment for the hybrid component electronic leads.

The foregoing objects and following advantages are achieved by the system of the present invention for mounting a hybrid electronic component to a PC board.

The system includes a set of brackets for mutually engaging a first surface of the PC board and a cover surface of the hybrid electronic component, wherein the cover surface has an arcuate shape when in a vacuum environment. The brackets are designed with legs having lengths and thicknesses for providing clearance between the cover surface of the hybrid and the first surface of the PC board for use when the hybrid electronic component is in a vacuum environment.

DETAILED DESCRIPTION OF THE PREFERRED EMBODIMENT

Figure 1:
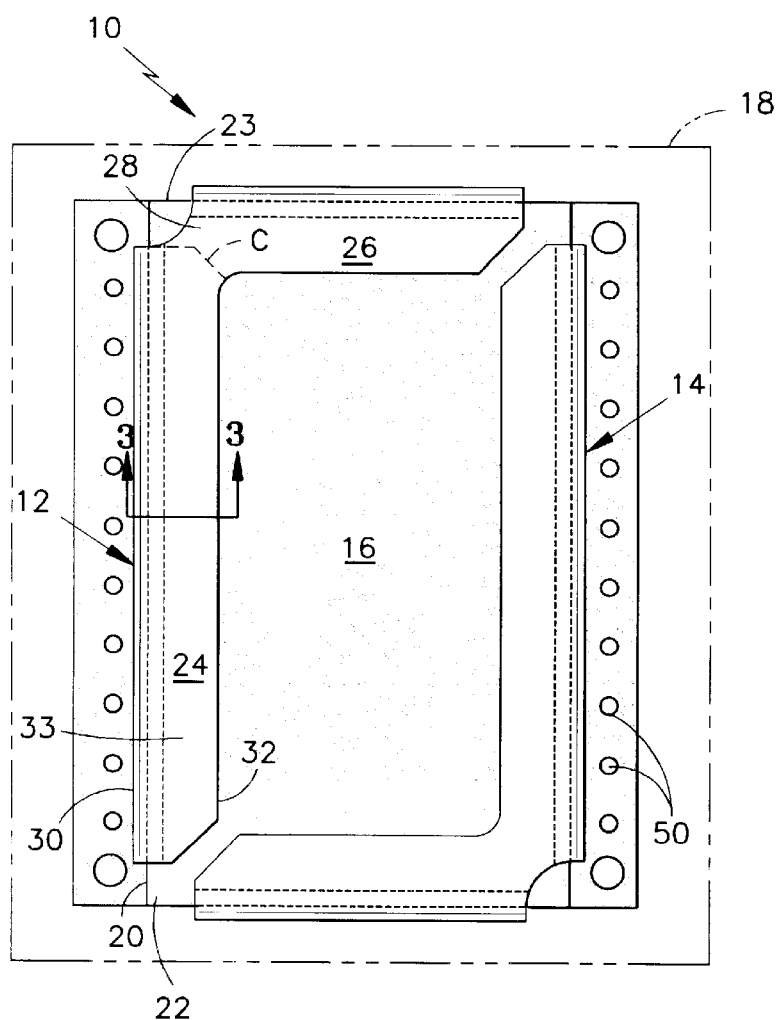
FIG. 1 is an overhead view of the bracket system of the present invention used for mounting the hybrid electronic component to a PC board, wherein the PC board is shown in dotted lines for clarity.
Figure 2:
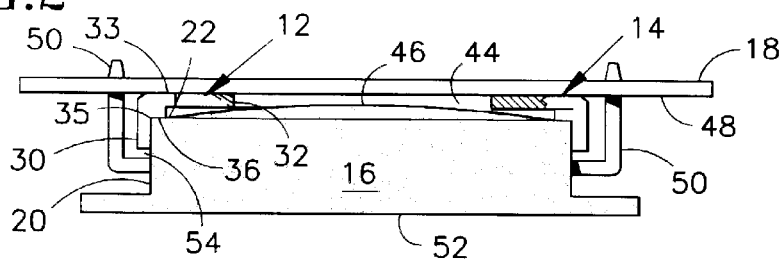
FIG. 2 is an elevational view of the brackets used for mounting the hybrid electronic component to the PC board while allowing for sufficient space therebetween and sufficient structural support and clearance for the hybrid leads.

Referring now to the drawings in detail, there is shown in FIGS. 1 and 2 an overhead elevational view of the system of the present invention for mounting a hybrid electric component to a PC board, designated generally as 10. As shown in FIGS. 1 and 2, system 10 generally includes a plurality of brackets 12 and 14 extending between and mutually engaging and connecting hybrid component 16 and PC board 18.

Preferably, brackets 12 and 14 are substantially identical and accordingly only one such bracket will be described in detail, it being understood that the description applies equally to both.

Figure 3:
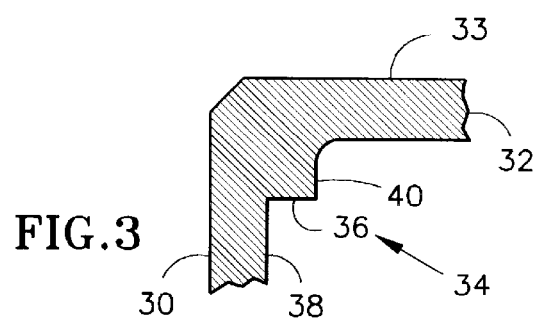
FIG. 3 is an enlarged cross-sectional view of the brackets shown in FIGS. 1 and 2, taken along lines 3—3 of FIG. 1, for supporting the PC board relative the hybrid electronic component.

As shown in FIGS. 1 and 2, bracket 12 preferably has an overall L-shaped configuration and an L-shaped cross section. The L-shaped configuration may be replaced with an I-shape depending upon the application, as indicated by the dotted cut lines C of FIG. 1, also having an L-shaped cross-section. Accordingly, for the L-shaped configuration, bracket 12 is in contact with sides 20, 22, and 23 of hybrid electronic component 16. Accordingly, as shown in FIG. 1, bracket 12 includes a first arm 24 and a second arm 26 which are positioned substantially at a right angle to each other and interconnected or integral at corner 28. In the I-shaped configuration, only the first arm 24 would be present. As indicated, and as shown in FIG. 2, the cross section of each arm 24 and 26 is also L-shaped forming a first leg 30 in contact with hybrid component 16 and a second leg 32 in contact with PC board 18. Leg 32 has a substantially smooth outer surface 33 on which PC board 18 is engaged and a smooth inner surface. However, while leg 30 includes a smooth outer surface, it also includes a stepped inner surface 34 as shown in FIG. 3, for engaging the edge area 35 of the hybrid electronic component 18. That is, as shown in FIG. 3, a step 36 is provided between surfaces 38 and 40 of the inner surface 34 of leg 30. Step 36 and surface 38 of leg 30 are positioned at a substantially right angle to each other defining a right angle surface for engaging the edge area 35 of the hybrid electronic component. As shown in FIG. 2, the length of leg 30 and the thickness of leg 32 allow for a clearance space 44 between the upper surface 46 of hybrid component 16 and the lower surface 48 of PC board 18. This clearance provides several important advantages to system 10, as discussed below.

To connect the brackets 12 and 14 to the hybrid 16 and PC board 18, the surfaces thereof adjacent these components are adhered thereto. Accordingly, the brackets function to firmly structurally support the PC board relative to the fragile hybrid leads 50 extending from the hybrid component toward the PC board, to which they are soldered, minimizing deflections of the leads at this critical location. Since the brackets are positioned between the hybrid and PC board, the underside 52 of the hybrid is freed up to permit it to be directly mounted to the electrical box structure, thereby increasing the thermal conductive path beyond the existing techniques described in the background. The brackets via space 44 also allow vacuum environment conditions to be satisfied. That is, the thin cover of the hermetically sealed hybrid component 12 bows outwardly, as shown in FIG. 1, typically approximately 0.040 inches due to an internal pressure of 15 to 30 psia when the hybrid component is in a vacuum environment. Accordingly, a clearance must be provided between the cover and the adjacent PC board 14 to prevent contact. This clearance 44 is provided by the bracket arrangement. Also, a clearance 54 is provided between the lower edge of leg 30 of bracket 12 and hybrid leads 50.

In use, brackets 12 and 14 are placed as shown in FIG. 2, with step surface 36 in contact with the edge surface area 35 of hybrid component 16. The bracket, on the step surface 36 and surface 38, as shown in FIG. 3, is adhered to the hybrid component 16. Similarly, the outer surface 33 of leg 32 of bracket 12 is adhered to the underside of PC board 18. The same assembly is performed for bracket 14. Accordingly, a sufficient clearance 44 is provided between the hybrid 16 and the PC board 18 for allowing for a bow in the hybrid cover under vacuum conditions, and for providing sufficient support for preventing relative motion between the hybrid component 16 and PC board 18 from damaging hybrid leads 50.

The primary advantage of this invention is that an improved packaging and mounting system is provided for use with a hybrid electronic component, a PC board and an electronics box.

Another advantage of this invention is that an improved packaging and mounting system is provided for use with a hybrid electronic component and a PC board such that sufficient hybrid component heat dissipation is allowed. Still another advantage of this invention is that an improved mounting and packaging system is provided for use with a hybrid electronic component and a PC board, which provides the required structural support for accounting for high vibratory loads which may arise. And still another advantage of this invention is that an improved mounting and packaging system is provided for use with hybrid electronic components, which system and method allows for use of the hybrid and PC board in a vacuum environment while maintaining a safe environment for the hybrid component electronic leads.

Although the invention has been shown and described with respect to a best mode embodiment thereof, it should be understood by those skilled in the art that the foregoing and various other changes, omissions, and additions in the form and detail thereof may be made without departing from the spirit and scope of the invention.

I claim:

1. A system for mounting a hybrid electronic component to a PC board, comprising:
   means for mutually engaging a first surface of the PC board and a cover surface of the hybrid electronic component, wherein the cover surface has an arcuate shape when in a vacuum environment;
   said means for mutually engaging comprising means for providing clearance between the cover surface of the hybrid and the first surface of the PC board for use when the hybrid electronic component is in a vacuum environment.

2. The system according to claim 1, further including means for fastening the means for mutually engaging to the PC board and hybrid electronic component.

3. The system according to claim 2, wherein said means for fastening comprises adhesive.

4. The system according to claim 1, wherein said means for mutually engaging comprises a bracket system positioned between the hybrid electronic component and the PC board.

5. The system according to claim 4, wherein said bracket system includes a first and second leg, wherein said first leg is adapted to engage the hybrid electronic component and said second leg is adapted to engage the PC board.

6. The system according to claim 5, wherein said first leg includes an inner surface with a stepped configuration for engaging an edge area of the hybrid electronic component.

7. The system according to claim 5, wherein said first leg has a length and said second leg has a thickness which provide for a substantial clearance between the hybrid electronic component and the PC board.

8. The system according to claim 5, wherein said bracket system includes at least two brackets, wherein said at least two brackets have a substantially L-shaped configuration and an L-shaped cross-section.

9. The system according to claim 5, wherein said bracket system includes at least two brackets, wherein said at least two brackets have a substantially I-shaped configuration and an L-shaped cross-section.

10. An electronic component assembly, comprising:
    a hybrid electronic component having a cover surface;
    a PC board having a first surface;
    means for mutually engaging said first surface of the PC board and said cover surface of the hybrid electronic component, wherein said cover surface has an arcuate shape when in a vacuum environment;
    said means for mutually engaging comprising means for providing clearance between said cover surface of the hybrid and said first surface of the PC board for use when the hybrid electronic component is in a vacuum environment.

11. The system according to claim 10, further including means for fastening the means for mutually engaging to the PC board and hybrid electronic component.

12. The system according to claim 11, wherein said means for fastening comprises adhesive.

13. The system according to claim 10, wherein said means for mutually engaging comprises a bracket system positioned between said hybrid electronic component and said PC board.

14. The system according to claim 13, wherein said bracket system includes a first and second leg, wherein said first leg is adapted to engage said hybrid electronic component and said second leg is adapted to engage said PC board.

15. The system according to claim 14, wherein said first leg includes an inner surface with a stepped configuration for engaging an edge area of said hybrid electronic component.

16. The system according to claim 14, wherein said first leg has a length and said second leg has a thickness which provide for a substantial clearance between said hybrid electronic component and said PC board.

17. The system according to claim 14, wherein said bracket system includes at least two brackets, wherein said at least two brackets have a substantially L-shaped configuration and an L-shaped cross-section.

18. The system according to claim 14, wherein said bracket system includes at least two brackets, wherein said at least two brackets have a substantially I-shaped configuration and an L-shaped cross-section.

* * * * *